(12) United States Patent
Finn

(10) Patent No.: US 8,673,741 B2
(45) Date of Patent: Mar. 18, 2014

(54) ETCHING A LASER-CUT SEMICONDUCTOR BEFORE DICING A DIE ATTACH FILM (DAF) OR OTHER MATERIAL LAYER

(75) Inventor: Daragh S. Finn, Beaverton, OR (US)

(73) Assignee: Electro Scientific Industries, Inc, Portland, OR (US)

( * ) Notice: Subject to any disclaimer, the term of this patent is extended or adjusted under 35 U.S.C. 154(b) by 172 days.

(21) Appl. No.: 13/168,020

(22) Filed: Jun. 24, 2011

(65) Prior Publication Data

US 2012/0329246 A1 Dec. 27, 2012

(51) Int. Cl.
*H01L 21/00* (2006.01)
(52) U.S. Cl.
USPC ........... 438/462; 438/667; 438/675; 438/690; 257/678; 257/774; 257/E21.602
(58) Field of Classification Search
USPC ................ 438/462, 667, 675, 672, 597, 690; 257/678, 774, E21.602
See application file for complete search history.

(56) References Cited

U.S. PATENT DOCUMENTS

| 7,776,720 | B2 | 8/2010 | Boyle et al. | |
|---|---|---|---|---|
| RE43,487 | E * | 6/2012 | O'Brien et al. | 264/400 |
| 8,294,282 | B2 * | 10/2012 | Hayashi et al. | 257/777 |
| 2001/0035401 | A1 | 11/2001 | Manor | |
| 2005/0082651 | A1 * | 4/2005 | Farnworth et al. | 257/678 |
| 2007/0123061 | A1 | 5/2007 | Evertsen et al. | |
| 2009/0191690 | A1 | 7/2009 | Boyle et al. | |
| 2010/0129984 | A1 | 5/2010 | Vakanas et al. | |
| 2010/0136766 | A1 | 6/2010 | Sakamoto et al. | |
| 2011/0298156 | A1 | 12/2011 | Hooper et al. | |
| 2012/0322239 | A1 * | 12/2012 | Singh et al. | 438/462 |

OTHER PUBLICATIONS

Kim, Dohyung et al., "Evaluation for UV Laser Dicing Process and its Reliability for Various Designs of Stack Chip Scale Package," 59th Electronic Components and Technology Conference, May 2009, pp. 1531-1536.
Li, Jianhua et al., "Laser Dicing and Subsequent Die Strength Enhancement Technologies for Ultra Thin Wafer," 57th Electronic Components and Technology Conference, May 2007, pp. 761-766.
Notification of Transmittal of the International Search Report and the Written Opinion of the International Searching Authority, or the Declaration mailed Jan. 21, 2013, for PCT/US2012/043815, filed Jun. 22, 2012.

* cited by examiner

*Primary Examiner* — Evan Pert
(74) *Attorney, Agent, or Firm* — Stoel Rives LLP

(57) ABSTRACT

Semiconductor die break strength and yield are improved with a combination of laser dicing and etching, which are followed by dicing an underlying layer of material, such as die attach film (DAF) or metal. A second laser process or a second etch process may be used for dicing of the underlying layer of material. Performing sidewall etching before cutting the underlying layer of material reduces or prevents debris on the kerf sidewalls during the sidewall etching process. A thin wafer dicing laser system may include either a single laser process head solution or a dual laser process head solution to meet throughput requirements.

12 Claims, 7 Drawing Sheets

ETCHING A LASER-CUT SEMICONDUCTOR BEFORE DICING A DIE ATTACH FILM (DAF) OR OTHER MATERIAL LAYER

TECHNICAL FIELD

This disclosure relates to laser processing systems and methods. In particular, this disclosure relates to laser processing systems and methods for micromachining (e.g., scribing or dicing) semiconductor devices.

BACKGROUND INFORMATION

Integrated circuits (ICs) are generally fabricated in an array on or in a semiconductor substrate. ICs generally include one or more layers formed over or in the substrate. The one or more overlying layers may be removed along scribing lanes or streets using a mechanical saw or a laser. After scribing, the substrate may be throughcut, sometimes called diced, using a saw or laser to separate the circuit components from one another.

When laser processing is used, the results tend to be highly material dependent. For example, a first laser type (or set of laser parameters) may be ideal for cutting semiconductors, while a second laser type (or set of laser parameters) may be ideal for cutting metals.

One example of a challenging problem is the singulation of semiconductor devices mounted on die attach film (DAF), a process sometimes referred to herein as "DAF dicing." This problem may be addressed in production by using mechanical diamond saws with ultra-thin blades because laser dicing with known processes tend to produce a die with lower mechanical strength compared to that produced by mechanical sawing. Incorporation of fragile low-k dielectric materials into these semiconductor devices along with reduction of the silicon wafer thickness has increased the difficulty for mechanical saw dicing, leading to slower throughputs and more yield losses. Using a traditional laser-only process for DAF dicing of thin silicon wafers also typically results in increased die pick failure (reduced die yield) manifested as, for example, uncut DAF ("double die"), overcut DAF ("anchoring"), and/or low die break strength (due to etch variance when etching after laser dicing the DAF).

Previously attempted solutions for DAF dicing include using lasers to scribe the low-k dielectric and/or semiconductor layers prior to mechanical saw dicing, combining laser dicing with a post-dicing etch process to strengthen the die, using a full-cut laser dicing system with two different lasers (or different sets of laser parameters such as pulse width), or freezing the DAF and stretching it until the tape fractures. A known method for dicing through both the semiconductor device and the DAF using a single laser dicing strategy results in a deposition of DAF material on the sidewalls of the semiconductor dies such that a subsequent xenon difluoride (XeF$_2$) etch process is adversely affected by this "DAF splash."

SUMMARY OF THE DISCLOSURE

In one embodiment, a method dices a semiconductor wafer that including a top surface and a bottom surface. The bottom surface is attached to an underlying layer of material. The method includes generating a first laser beam, and providing relative movement of the first laser beam with respect to the top surface of the semiconductor wafer to at least partially dice the semiconductor wafer from the top surface along one or more dicing streets. The first laser beam forms a kerf defined by sidewalls in the semiconductor wafer. The method further includes etching the sidewalls of the at least partially diced semiconductor wafer to reduce or remove a heat affected zone (HAZ) produced in the sidewalls by the first laser beam, and cutting through the underlying layer of material along the one or more dicing streets so as to separate a die from the semiconductor wafer having at least a predetermined die break strength and to produce a yield of operational die that equals at least a predetermined minimum yield. The sidewall etching is performed before the cutting through the underlying layer of material to reduce or prevent debris on the sidewalls from the underlying layer of material during the etching of the sidewalls.

In certain embodiments of the method, the underlying layer of material includes a die attach film (DAF). In such embodiments, cutting through the underlying layer of material includes generating a second laser beam, and providing relative movement of the second laser beam with respect to the DAF along the one or more dicing streets. The first laser beam may include a pulsed laser beam having an ultraviolet (UV) wavelength and with nanosecond or picosecond temporal pulsewidths. The second laser beam may include a pulsed laser beam having a visible wavelength and with nanosecond temporal pulsewidths.

In certain other embodiments, etching the sidewalls includes using a first etchant configured to remove semiconductor material from the semiconductor wafer, and cutting through the underlying layer of material includes using a second etchant configured to remove the DAF material. In one embodiment, the first etchant includes a spontaneous etchant, such as xenon difluoride (XeF$_2$). Plasma etching, wet photoresist strip, or wet etching techniques may be used to cut through the DAF.

In certain embodiments, the top surface includes one or more device layers including a pattern of multiple, mutually spaced apart electronic circuit components separated by one or more streets. The method further includes, before generating the first laser beam, applying a coating to the semiconductor wafer to protect the semiconductor wafer from debris generated by the first laser beam, in a first pass of the first laser beam along the one or more dicing streets, scribing the one or more device layers, and after at least partially dicing the semiconductor wafer in a second pass of the first laser beam along the one or more streets, and before etching the sidewalls, washing the semiconductor wafer to remove the coating.

In certain embodiments, the underlying layer of material includes a metal. In certain such embodiments, cutting through the underlying layer of material includes generating a second laser beam, and providing relative movement of the second laser beam with respect to the metal along the one or more dicing streets. In other such embodiments, cutting through the underlying layer of material includes using a second etchant configured to remove the metal.

In one embodiment, a laser processing system dices a semiconductor wafer including a top surface and a bottom surface. The bottom surface is attached to an underlying layer of material. The system includes a first laser processing head for generating a first laser beam, and for providing relative movement of the first laser beam with respect to the top surface of the semiconductor wafer to at least partially dice the semiconductor wafer from the top surface along one or more dicing streets. The first laser beam forms a kerf defined by sidewalls in the semiconductor wafer. The system further includes a first etch station for etching the sidewalls of the at least partially diced semiconductor wafer to reduce or remove a heat affected zone (HAZ) produced in the sidewalls by the first laser beam, and a dicing station for cutting through the underlying layer of material along the one or more dicing streets so as to separate a die from the semiconductor wafer having at least a predetermined die break strength and to produce a yield of operational die that equals at least a predetermined minimum yield. The first etch station performs the sidewall etching before the dicing station cuts through the underlying layer of material to reduce or prevent debris on the sidewalls from the underlying layer of material during the etching of the sidewalls.

In certain system embodiments, the first laser processing head includes a first laser source for generating ultraviolet (UV) laser pulses with nanosecond or picoseconds temporal pulsewidths.

In certain system embodiments, the first etch station uses a spontaneous etchant to remove semiconductor material from the sidewalls of the semiconductor wafer. The spontaneous etchant may include xenon difluoride ($XeF_2$).

In certain system embodiments, the underlying layer of material includes DAF, and the dicing station includes a second laser processing head including a second laser source for generating a second laser beam comprising visible laser pulses with nanosecond temporal pulsewidths for cutting the DAF.

In certain system embodiments, the underlying layer of material comprises a metal backing, and the dicing station includes a second laser processing head including a second laser source for generating a second laser beam for cutting the metal backing.

In certain system embodiments, the underlying layer of material includes DAF, and the dicing station includes a second etch station for cutting through the DAF.

In certain system embodiments, the underlying layer of material includes a metal backing, and the dicing station includes a second etch station for cutting through the metal backing.

In certain embodiments, the system further includes a coating station, before the first laser processing head, for applying a protective coating to the semiconductor wafer. Such embodiments may further include a wash station, after the first laser processing head and before the first etch station, for removing the protective coating along with debris from the semiconductor wafer.

Additional aspects and advantages will be apparent from the following detailed description of preferred embodiments, which proceeds with reference to the accompanying drawings.

DETAILED DESCRIPTION OF PREFERRED EMBODIMENTS

Figure 1:
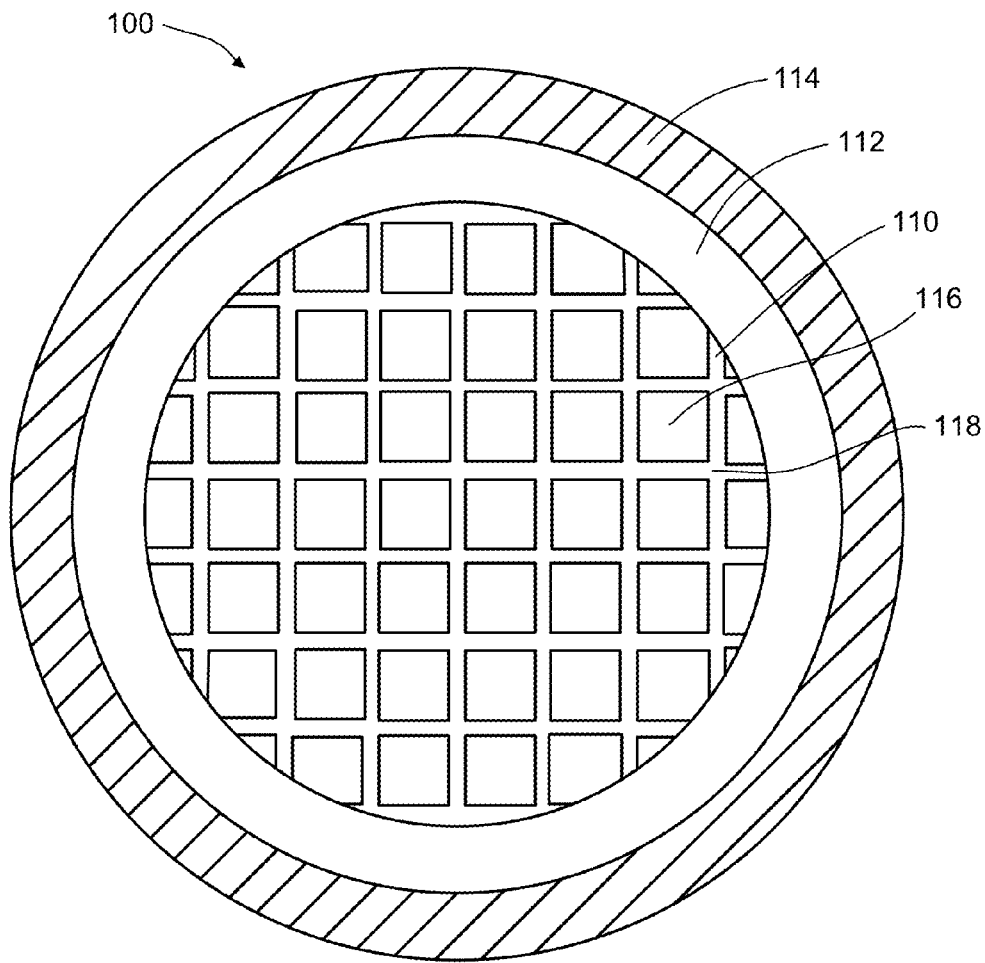
FIG. 1 schematically illustrates a top view of a workpiece that includes a semiconductor wafer mounted on a dicing tape disposed in a wafer ring.

Systems and methods disclosed herein provide a laser dicing solution that reduces or eliminates problems caused by material splashing onto semiconductor sidewalls. The disclosed embodiments provide a higher yield (e.g., higher die break strength) and a higher die pick percentage than those provided by conventional full laser cut systems.

Although many of the examples herein are directed to thin wafer dicing, and in particular to dicing a semiconductor material attached to a die attach film (DAF), other embodiments include dicing a workpiece that includes a semiconductor layer adjacent to a layer comprising any other material that may splash onto the sidewalls of the semiconductor. For example, certain embodiments provide dicing of a workpiece that includes a semiconductor layer adjacent or attached to a metallic layer.

According to certain embodiments, a thin wafer dicing laser system may include either a single laser process head solution or a dual laser process head solution to meet throughput requirements of about 15 wafers per hour (WPH) for wafers that are less than about 50 µm thick, having diameters of about 300 mm, and with die sizes of about 10 mm×10 mm. Artisans will recognize from the disclosure herein that any other wafer size and/or die size may also be processed using the embodiments disclosed herein.

A first process laser head, according to one embodiment, includes a single nanosecond or picosecond ultraviolet (UV) laser. Depending on the particular target material processed by the single process laser head, other types of lasers may be used. For example, an infrared (IR) or green laser may be used. The laser may be a diode-pumped solid-state laser, a mode-locked laser, or any other laser suitable for machining the semiconductor and other materials of the wafer. Beam positioning may be controlled using, for example, galvanometers and a telecentric scan lens to cut a tooling path along a dicing lane or street. Each scan field or region may be scribed, followed by semiconductor (e.g., silicon) dicing, before an XY stage is indexed to a next scan field.

Certain embodiments also use a second process laser head. The laser of the second process laser head is selected to process a material adjacent to the semiconductor. For example, the laser of the second process laser head may include a low cost nanosecond laser with a visible wavelength used to cut the DAF. As another example, the laser of the second process laser head may include a pulsed or continuous wave (CW) laser with a UV, green, or IR wavelength (e.g., a $CO_2$ laser) used to cut metal.

In certain embodiments, a method of dicing a semiconductor wafer attached to an underlying layer of material (e.g., DAF or metal backing) includes at least partially dicing the semiconductor wafer using a laser beam, etching the sidewalls to reduce or remove a heat affected zone (HAZ), followed by cutting through the underlying layer of material with the same laser beam or a different laser beam. An etchant for sidewall etching of the semiconductor wafer may be, but is not limited to, a spontaneous etchant such as xenon difluoride ($XeF_2$). In certain embodiments, other types of etching, such as wet chemical etching or plasma etching, may also be used.

Cutting through an underlying material such as DAF or metal backing tends to produce debris or splash on the sidewalls that can reduce the effectiveness of the etch process to remove the HAZ. Thus, performing the sidewall etching before cutting through the underlying layer of material reduces or prevents debris or splash on the sidewalls such that the sidewall etching process is more effective.

In certain other embodiments, a method of dicing a semiconductor wafer attached to an underlying layer of material (e.g., DAF or metal backing) includes at least partially dicing the semiconductor wafer using a laser beam, etching the sidewalls to reduce or remove a heat affected zone (HAZ), followed by cutting through the underlying layer of material with a second etching process. For example, after sidewall etching of the semiconductor wafer using a spontaneous etchant, plasma etching, wet photoresist strip, or wet etching may be used to etch through the DAF. As another example, for embodiments where the underlying layer of material is a metal backing, the metal in the dicing street may be cut through using lithography and plasma etching. Table 1 provides examples of plasma etching specific chemistries for etching metal or other materials used for the underlying layer of material.

Example Materials Etched by Corresponding Gas Systems

TABLE 1

| Material(s) Processed | Etch Chemistry | Reaction Products |
|---|---|---|
| Si | $CF_4$, $SF_6$, HBr, $Cl_2$, $NF_3$, HI | $SiF_4$, $SiCl_4$, $SiF_2$, $SiCl_4$, $SiBr_4$, $SiI_4$ |
| $SiO_2$, $Si_3N_4$ | $CHF_3$, $C_4F_8$, $C_2F_6$, $SF_6$, $NF_3$ | $SiF_4$, CO, $CO_2$ |
| Al | $BCl_3$, HCl, $Cl_2$ | $Al_2Cl_6$, $AlCl_3$ |
| W | $SF_6$, $CF_4$, $NF_3$, $Cl_2$, $O_2$ | $WF_6$, $WOCl_x$ |
| Ti, TiN | $Cl_2$ | $TiCl_4$ |
| Polymers | $O_2$, $O_2/CF_4$, $SO_2$ | CO, $H_2S$, $CO_2$, HF, $H_2$, $H_2O$ |
| InP, HgCdTe | $CH_4/H_2$ | $In(CH_3)_3$, $PH_3$, $Cd(CH_3)_2$ |
| GaAs | $Cl_2$, $BCl_3$ | $Ga_2Cl_6$, $AsCl_3$ |

The embodiments disclosed herein increase die yield and die strength across the wafer, improve standard deviation and process stability, and improve die pick as a direct result of DAF cutting. The disclosed embodiments may also reduce the consumption of etchant used for sidewall etching, which may result in a lower cost of ownership (CoO), lower cost per wafer, and added tool value.

Reference is now made to the figures in which like reference numerals refer to like elements. In the following description, numerous specific details are provided for a thorough understanding of the embodiments disclosed herein. However, those skilled in the art will recognize that the embodiments can be practiced without one or more of the specific details, or with other methods, components, or materials. Further, in some cases, well-known structures, materials, or operations are not shown or described in detail in order to avoid obscuring aspects of the embodiments. Furthermore, the described features, structures, or characteristics may be combined in any suitable manner in one or more embodiments.

FIG. 1 schematically illustrates a top view of a workpiece 100 that includes a semiconductor wafer 110 mounted on a dicing tape 112 disposed in a wafer ring 114. A top surface (shown in FIG. 1) of the semiconductor wafer 110 is divided into a plurality of semiconductor chips 116 along scribe lines or streets 118. The semiconductor chips 116 include electronic circuit components formed on or in one or more device layers (also referred to herein as a "device stack") of the semiconductor wafer 110. A bottom surface (not shown) of the semiconductor wafer 110 may include a die attach film (DAF) that serves as an adhesive at the time of mounting the semiconductor chips 116 to a wiring substrate (not shown). The DAF may comprise a polymer. By way of example only, and not by limitation, DAF materials are available from Hitachi (e.g., FH-900) or from Nitto (e.g., EM-500 or EM-700).

Figure 2A:
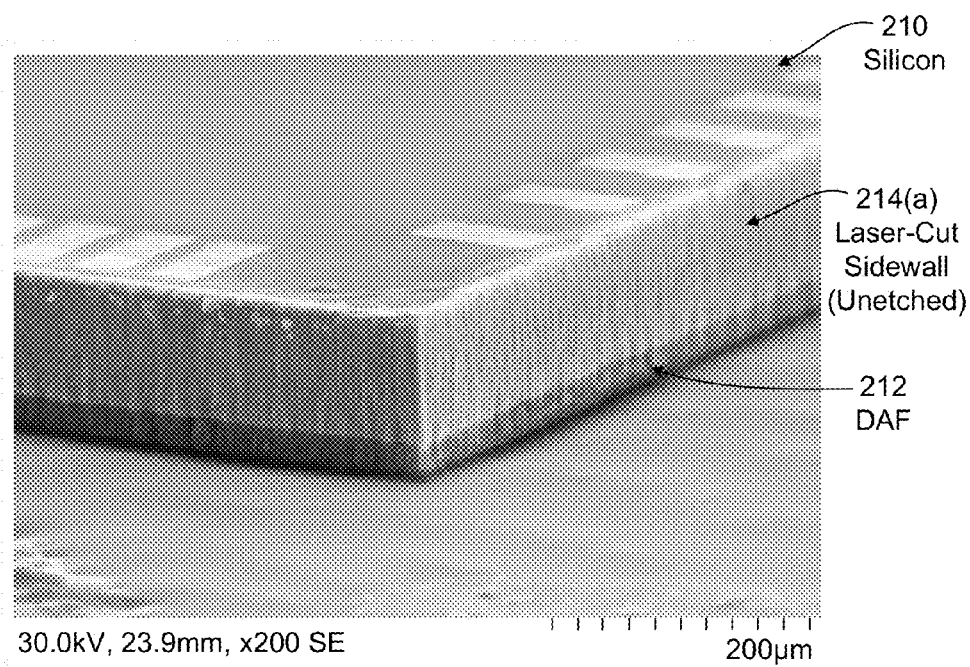
FIG. 2A is a scanning electron microscope (SEM) micrograph of silicon with DAF diced using a full cut laser process, before sidewall etching.
Figure 2B:
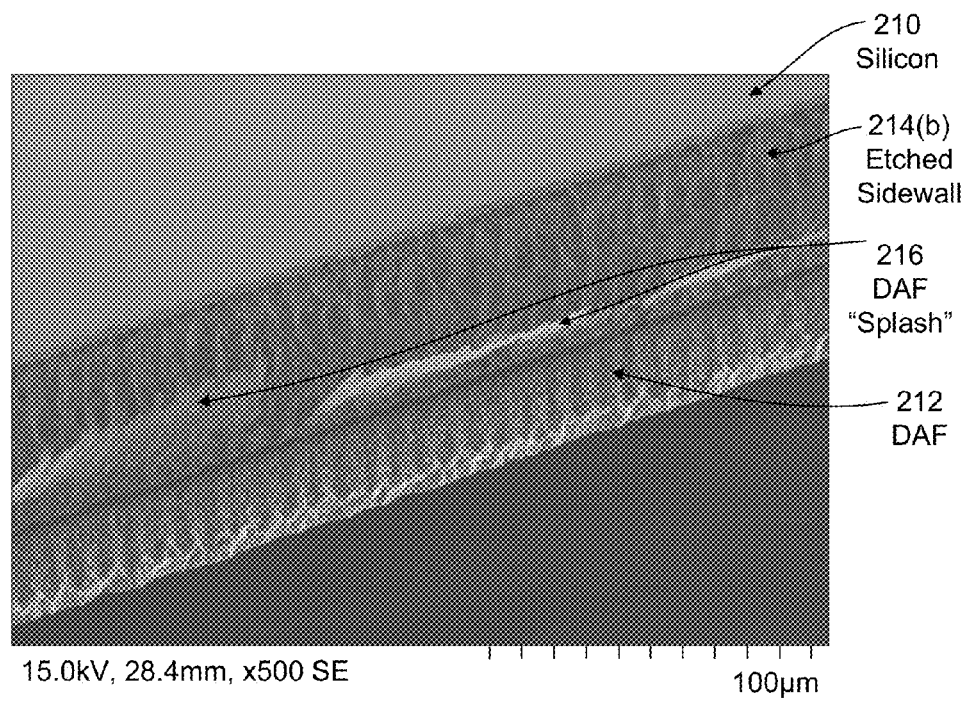
FIG. 2B is an SEM micrograph of the silicon with DAF shown in FIG. 2A, after sidewall etching.

FIG. 2A is a scanning electron microscope (SEM) micrograph of silicon 210 with DAF 212 diced using a full cut laser process, before sidewall etching. As discussed above, an unetched laser-cut sidewall 214(a) shown in FIG. 2A includes a heat affected zone (HAZ) that reduces the mechanical strength of the die. The HAZ may be removed through sidewall etching. FIG. 2B is an SEM micrograph of the silicon 210 with DAF 212 shown in FIG. 2A, after sidewall etching. FIG. 2B shows the deposited DAF "splash" 216 on the etched sidewall 214(b). The DAF deposit or DAF splash 216 impedes the etching process (e.g., using $XeF_2$) and reduces the die strength of the silicon wafer 210. At least a portion of the DAF splash 216 in FIG. 2B is tilting or falling off the etched sidewall 214(b) because the silicon attached to a portion of the DAF splash 216 has been etched away. Thus, the DAF splash 216 is lifting off the etched sidewall 214(b) and may be at least partially hinging at the interface of the silicon 210 and the DAF 212.

Figure 3:
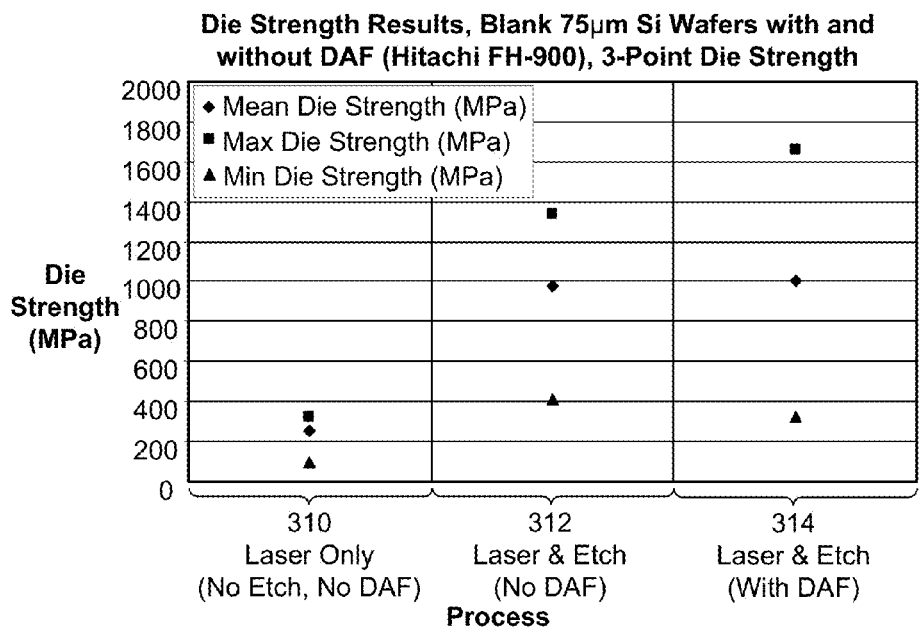
FIG. 3 is a graph of measured die break strengths for three silicon wafers.

FIG. 3 is a graph of measured die break strength for three silicon wafers. The illustrated data (mean die strength, maximum die strength, and minimum die strength) was measured using a three-point die strength test on blank 75 μm silicon (Si) wafers (with and without DAF). A first column 310 shows data for a first silicon wafer without DAF that has been laser diced, but which has not been etched. A second column 312 shows data for a second silicon wafer without DAF that has been laser diced and etched. A third column 314 shows data for a third silicon wafer with DAF that has been laser diced through both the silicon and the DAF before being etched. In this example, the DAF is FH-900 available from Hitachi. As shown, the minimum die strength for the third wafer is lower than the minimum die strength of the second wafer because DAF splash prevents the etching process from sufficiently removing the HAZ, which allows micro cracks to propagate through the silicon when stress is applied.

Those skilled in the art will recognize that a three-point bending technique may be used to generate a fracture across a silicon wafer. Generally a three-point die strength test includes placing a silicon wafer between two supports and asserting a force in the middle of the wafer. The force at which the wafer fractures is measured and used in a known three-point bending formula that includes the thickness of the silicon wafer, the width of the silicon die/sample, and the span between the two supports. The formula calculates a stress per unit area of the silicon wafer. Thus, the mechanical strength of the die may be determined for various laser processing techniques.

Figure 4:
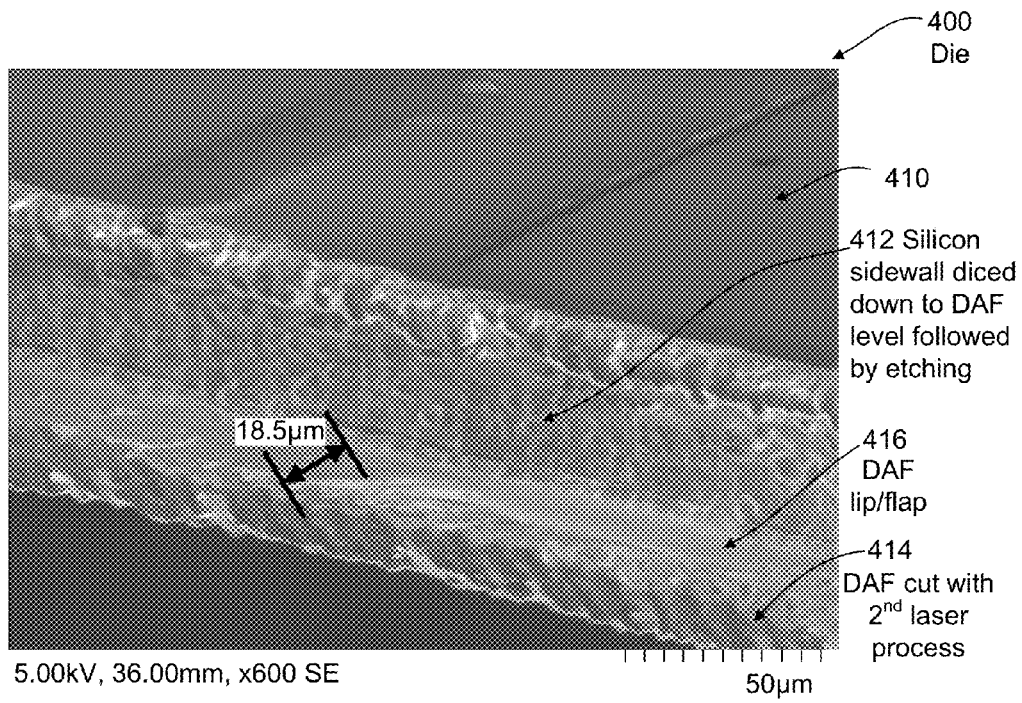
FIG. 4 is an SEM micrograph of a die that is diced according to one embodiment.

FIG. 4 is an SEM micrograph of a die 400 that is diced according to an embodiment disclosed herein. FIG. 4 shows a top surface 410 of the die 400 and an etched silicon sidewall 412. Although not shown, in certain embodiments one or more device layers may be formed on or in the top surface 410 and/or the top surface 410 may be covered with a photoresist or other coating material. The silicon sidewall 412 is formed by laser dicing the silicon from the top surface 410 down to a bottom surface (not shown) of the silicon, which is attached to a layer of DAF 414. Before cutting the DAF 414, the silicon sidewall 412 is etched for stress relief (e.g., to remove HAZ created by laser processing the silicon). Following the sidewall etching, a second laser process is used to dice the DAF 414. In addition, or in other embodiments, the etched silicon sidewall 412 is coated (e.g., with parylene or other polymer) to protect the etched silicon sidewall 412 during the second laser process and/or during subsequent processing steps.

FIG. 4 also shows a DAF lip or flap 416 created by widening the silicon sidewall 412 during the sidewall etching process. For clarity, a DAF lip or flap 630 is also shown in FIG. 7E. In certain embodiments, the sidewall etching process is controlled such that the size of the DAF lip or flap 412 allows the second laser process to cut the DAF 414 without interference from (or interfering with) the etched silicon sidewall 412. After dicing the DAF 414, in the example shown in FIG. 4, the DAF lip or flap 416 for the die 400 is about 18.5 µm wide. After the silicon is at least partially diced and etched along a street between the die 400 and an adjacent die (not shown), the distance between silicon of the die 400 and the adjacent die determines the accuracy for aligning the laser beam along the street during the second laser process. The size of the resulting DAF lip or flap 416 may be determined by the spot size and other parameters of the laser beam during the second laser process. In embodiments where the DAF 414 is removed in a second etching process, rather than in a second laser process, the DAF lip or flap 416 may be reduced or completely removed.

Figure 5:
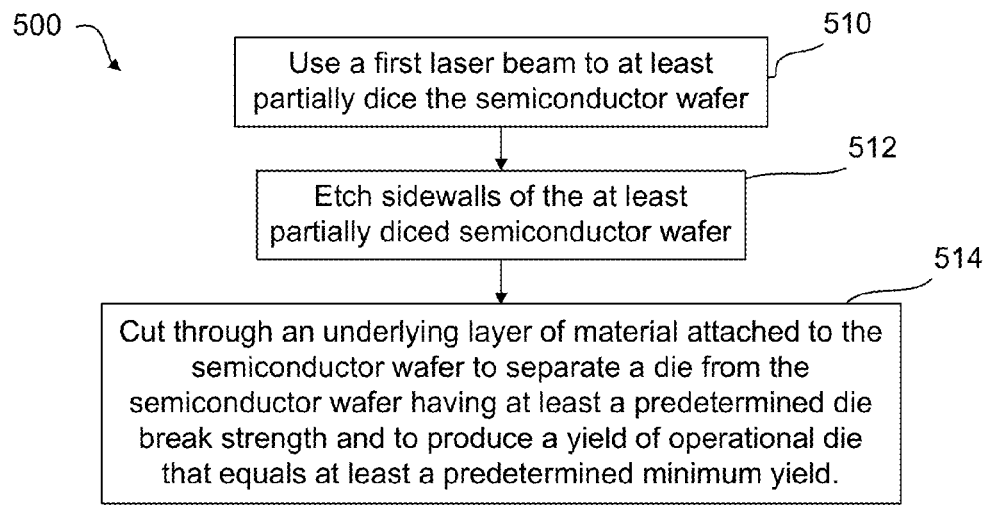
FIG. 5 is a flowchart of a process for dicing a semiconductor wafer according to one embodiment.

FIG. 5 is a flowchart of a process 500 for dicing a semiconductor wafer according to one embodiment. The semiconductor wafer includes a top surface and a bottom surface. The bottom surface is attached to an underlying layer of material. In certain embodiments, the underlying layer of material includes DAF. In other embodiments, the underlying layer of material includes, for example, metal. The method 500 includes using 510 a first laser beam to at least partially dice the semiconductor wafer. In certain embodiments, the first laser beam removes a sufficient amount of semiconductor material so as to at least partially expose a surface of the underlying layer of material along a dicing street. In other embodiments, the first laser beam only partially dices the semiconductor material along the street such that the underlying layer of material is not exposed. In such embodiments, leaving a thin layer (e.g., about 1 µm to 3 µm or more) of semiconductor over the underlying layer of material decreases the likelihood splashing the underlying layer of material onto the sidewalls of the semiconductor before the etching process.

The method 500 further includes etching 512 the sidewalls of the at least partially diced semiconductor wafer to reduce or remove HAZ produced in the sidewalls by the first laser beam. Then, the method 500 includes cutting 514 through the underlying layer of material along the one or more dicing streets so as to separate a die from the semiconductor wafer having at least a predetermined die break strength and to produce a yield of operational die that equals at least a predetermined minimum yield. The predetermined die break strength and the predetermined minimum yield depend on the particular application. For example, a bare/mirror SiO2 wafer, according to one embodiment, has a predetermined die break strength of about 500 MPa. In addition, or in other embodiments, the predetermined minimum yield is in a range between 99.5% and 100%. The sidewall etching is performed before the cutting through the underlying layer of material to reduce or prevent debris on the sidewalls from the underlying layer of material during the etching of the sidewalls. The cutting of the underlying layer of material may be performed using either a second laser beam or a second etchant configured to remove the underlying layer of material along the one or more dicing streets.

FIGS. 6A, 6B, 6C, 6D, and 6E schematically illustrate cross-sectional diagrams of a workpiece 600 during different steps of a dicing process according to certain embodiments. The workpiece 600 includes a device stack 610 formed over a semiconductor (e.g., silicon) wafer 612. In this example, DAF 614 is affixed to a back or bottom surface of the semiconductor wafer 612. The device stack 610 may include electronic circuit components including one or more device layers formed on or in a top surface of the semiconductor wafer 612. The one of more device layers of the device stack 610 may include, for example, silicon dioxide ($SiO_2$) and/or silicon-nitride ($Si_yN_x$) (e.g., $Si_4N_3$) used for passivation and/or encapsulation, one or more metallic layers separated by dielectric layers (e.g., SiN), and/or a low-k dielectric layer.

Figure 6A:
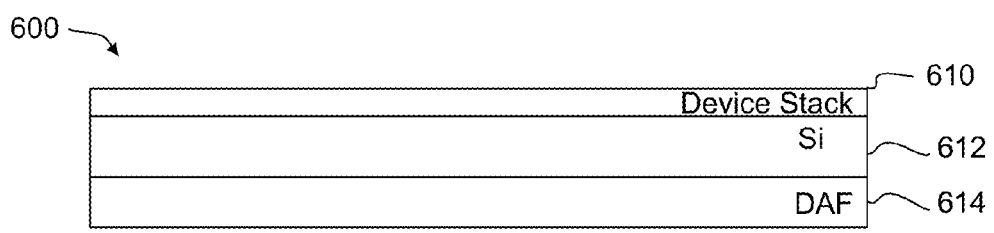
FIGS. 6A, 6B, 6C, 6D, and 6E schematically illustrate cross-sectional diagrams of a workpiece during different steps of a dicing process according to certain embodiments.
Figure 6B:
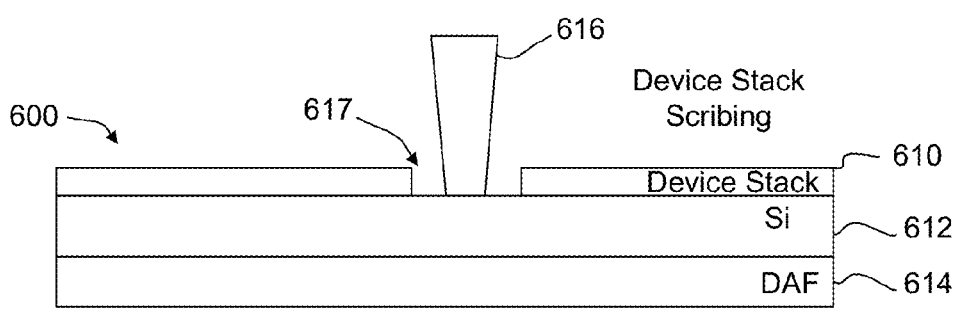
Figure 6C:
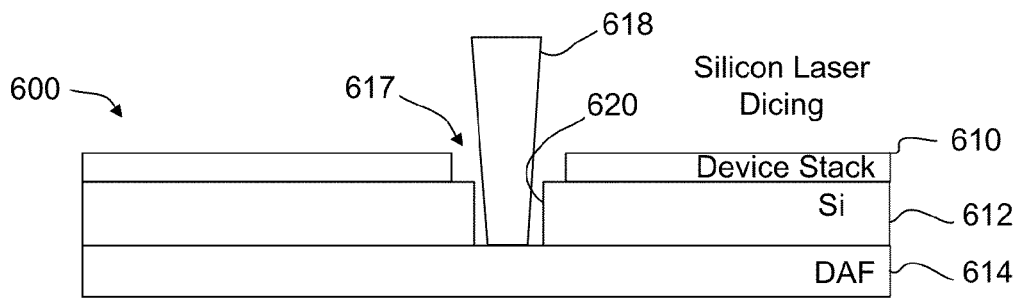

As shown in FIG. 6B, a first laser beam 616 scribes the device stack 610 to expose the underlying semiconductor substrate 612 along a dicing street 617. In FIG. 6C, a second laser beam 618 at least partially dices the semiconductor wafer 612. In one embodiment, the first laser beam 616 and the second laser beam 618 are generated by different laser sources and/or have different laser parameters. In another embodiment, the first laser beam 616 and the second laser beam 618 shown in FIG. 6C represent different passes of the same laser beam along the dicing street 617. In yet other embodiments, both the device stack 610 and at least a portion of the semiconductor wafer 612 are cut along the dicing street 617 in a single pass of a single laser beam. As discussed above, although the second laser beam 618 in FIG. 6C appears to remove a sufficient portion of the semiconductor wafer 612 so as to expose the underlying DAF 614, certain embodiments leave a few microns of semiconductor material over the DAF 614 to reduce or prevent splashing of the DAF 614 onto the sidewalls 620 of the semiconductor wafer 612 before etching.

Figure 6D:
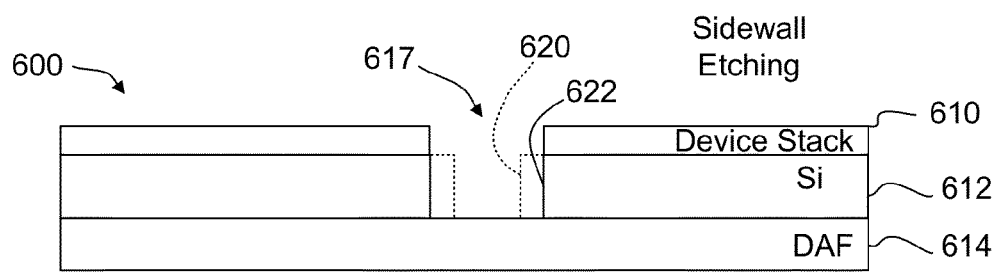

FIG. 6D represents the sidewall etching step. In FIG. 6D, the original sidewalls 620 formed by the second laser beam 618 in FIG. 6C are represented as dashed lines. The sidewall etching step removes a portion of the original sidewalls 620 (e.g., a portion including HAZ) to form etched sidewalls 622.

Figure 6E:
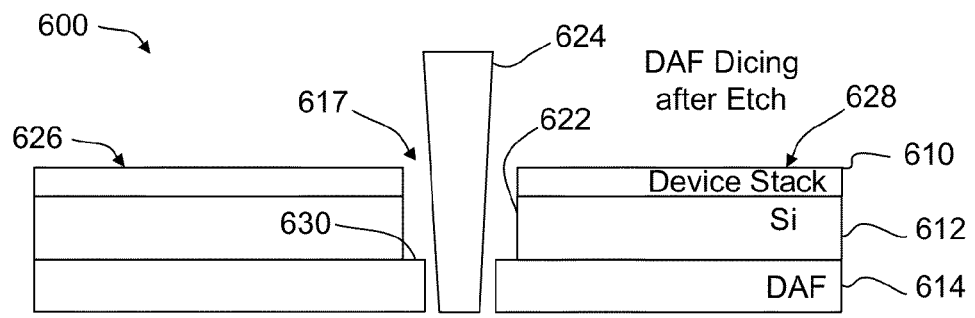

In FIG. 6E, a third laser beam 624 dices the DAF 614 so as to separate a first die 626 from a second die 628. In one embodiment, the second laser beam 618 and the third laser beam 6624 are generated by different laser sources and/or have different laser parameters. In another embodiment, the second laser beam 616 and the third laser beam 618 represent different passes of the same laser beam along the dicing street 617. As shown in FIG. 6E, processing the DAF 614 using the third laser beam 624 results in the DAF lip or flap 630 discussed above with respect to FIG. 4. In other embodiments, a second etching step is used instead of the third laser beam 624 to cut through the DAF 614. Such embodiments may reduce or eliminate the DAF lip or flap 630.

Figure 7:
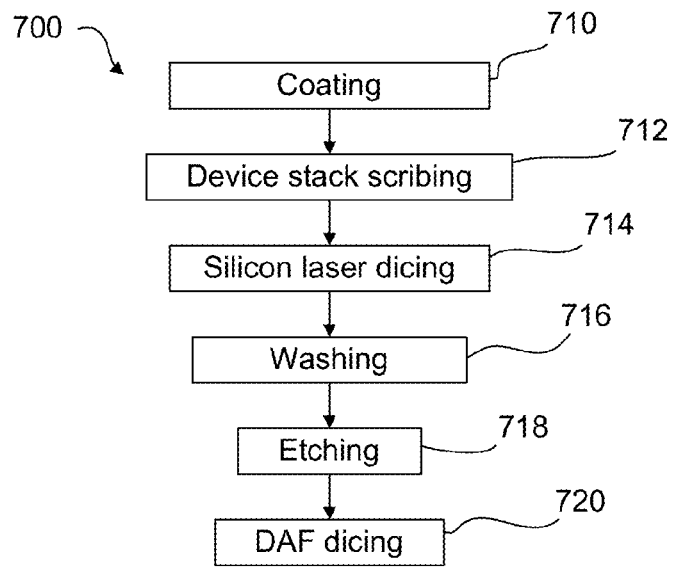
FIG. 7 is a flowchart of a process for dicing a workpiece including a device stack formed in or on a silicon substrate having a back or bottom surface affixed to DAF according to one embodiment.

FIG. 7 is a flowchart of a process 700 for dicing a workpiece including a device stack formed in or on a silicon substrate having a back or bottom surface affixed to DAF according to one embodiment. The process 700 includes coating 710 the workpiece with a protective coating to protect against debris from scribing and dicing processes. The protective coating may include a liquid resin (e.g., silicon glycol copolymer). As described above, the process 700 further includes device stack scribing 712 followed by silicon laser dicing, which at least partially dices the silicon substrate but may leave a few microns of silicon over the DAF along a dicing street. The method 700 further includes washing 716 the workpiece to removing the protective coating. The workpiece may be washed with, for example, deionized water or another solvent. The process 700 also includes etching 718 sidewalls of a kerf cut into the silicon substrate during the laser dicing. After etching 718, the process 700 includes DAF dicing 720. Performing the DAF dicing 720 after the etching 718 reduces or avoids the presence of DAF on the sidewalls during the etching 718, which increases the ability of the etching 718 to reduce or remove HAZ so as to increase die break strength. Performing the DAF dicing 720 after the etching 718 also reduces or prevents splashed DAF from hinging or falling from the sidewalls during later processing (e.g., packaging).

Figure 8:
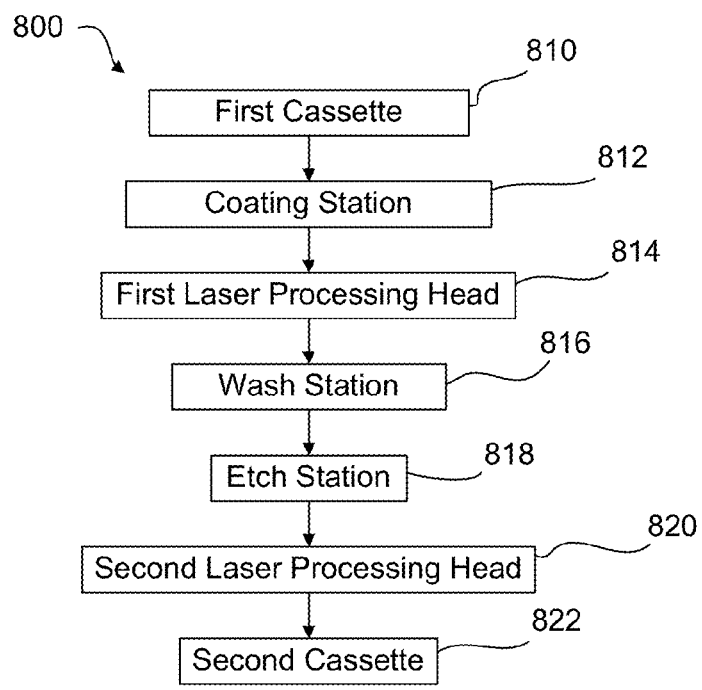
FIG. 8 is a block diagram of a system for dicing a semiconductor wafer having a surface attached to an underlying layer of material according to one embodiment.

FIG. 8 is a block diagram of a system 800 for dicing a semiconductor wafer having a surface attached to an underlying layer of material according to one embodiment. In certain embodiments, the underlying layer of material includes DAF. In other embodiments, the underlying layer of material includes, for example, metal. The system 800 includes a first cassette 810, a coating station 812, a first laser processing head 814, a wash station 816, an etch station 818, a second laser processing head 820, and a second cassette 822. Skilled persons in the art will recognize from the disclosure herein that the system 800 in other embodiments may include fewer elements (e.g., a single cassette and/or a single laser processing head) or additional elements.

The first cassette 810 may include a carrier configured to hold a stack of semiconductor wafers that can be sequentially loaded (e.g., by a robot) for dicing by the system 800. The coating station 812 may spin a protective coating 710 onto a semiconductor wafer to protect against debris from scribing and dicing processes. The first laser processing head 814 includes a laser source for generating a first laser beam and a motion stage for providing relative movement of the first laser beam with respect to the top surface of the semiconductor wafer to at least partially dice the semiconductor wafer from the top surface along one or more dicing streets. The first laser beam forms a kerf defined by sidewalls in the semiconductor wafer. The wash station 816 then removes the protective coating along with any debris produced by the first laser beam.

The etch station 818 etches the sidewalls of the at least partially diced semiconductor wafer to reduce or remove a heat affected zone (HAZ) produced in the sidewalls by the first laser beam. Then, the second laser processing head 820 cuts through the underlying layer of material along the one or more dicing streets so as to separate a die from the semiconductor wafer having at least a predetermined die break strength and to produce a yield of operational die that equals at least a predetermined minimum yield. Performing the sidewall etching before cutting through the underlying layer of material reduces or prevents debris on the sidewalls from the underlying layer of material during the etching of the sidewalls. Finally, the die is loaded into the second cassette 822 for further processing. In certain embodiments, the second laser processing head 820 is replaced with a second etch station configured to cut through the underlying layer of material using etching, as discussed herein. Thus, the second laser processing head 820 may be referred to as a "dicing station."

FIGS. 9A, 9B, 9C, and 9D schematically illustrate a side perspective view of a workpiece 900 including a metal backing 914 being diced according to certain embodiments. The workpiece 900 includes one or more device layers 910 formed over a semiconductor wafer 912 (e.g., silicon). In this example, metal 914 is affixed to the back surface of the semiconductor wafer 912.

Figure 9A:
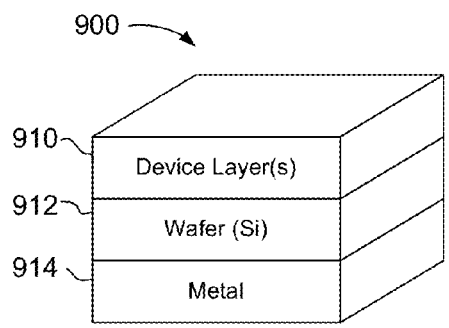
FIGS. 9A, 9B, 9C, and 9D schematically illustrate side perspective views of a semiconductor wafer including a metal backing being diced according to certain embodiments.
Figure 9B:
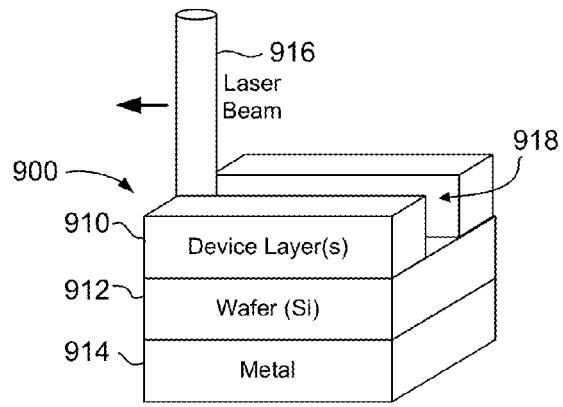

As shown in FIG. 9B, a dicing process includes a first pass of a laser beam 916 along a street 918 of the workpiece 900 (e.g., using an X-Y translation stage that provides relative motion of the laser beam 916 in the direction of the arrow with respect to the street 918). The first pass of the laser beam 916 scribes the workpiece 900 by removing the one or more device layers 910 so as to expose the underlying semiconductor wafer 912 along the street 918. The laser parameters used for the first pass of the laser beam 916 may be configured to process a combination of metals (e.g., copper) and low-k dielectrics in the street 918 of the one or more device layers 910. In an example embodiment, a UV or green laser source is used to generate the laser beam 916 for the first pass with pulses having temporal pulse durations in a range between about 12 ns and about 14 ns.

Figure 9C:
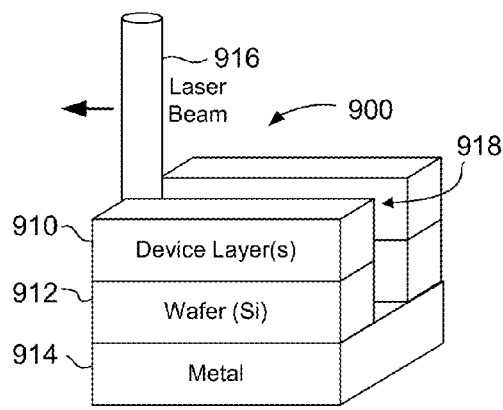
Figure 9D:
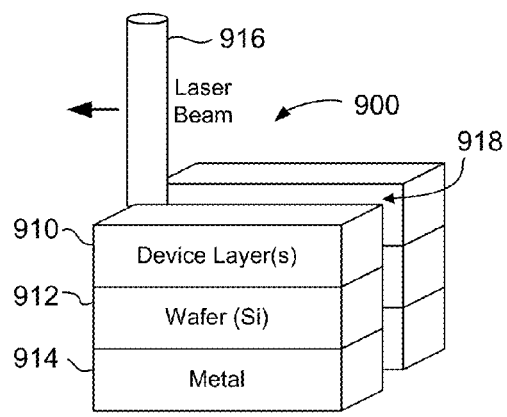

A next step of the dicing process, as shown in FIG. 9C, includes a second pass of the laser beam 916 along the street 918 to cut through the semiconductor wafer 912. During the second pass, the laser beam 916 may be generated by the same UV or green laser source to provide laser pulses having temporal pulse durations in a range between about 1 nanoseconds and about 3 nanoseconds. Although not shown, the sidewalls within the street 918 are then etched. Following the sidewall etching, a next step of the dicing process, as shown in FIG. 9D, includes a third pass of the laser beam 916 along the street 918 to cut through the metal 914. In the third pass, according to one embodiment, the laser beam 916 has a velocity with respect to the workpiece 900 in a range between about 100 mm/s and about 4,000 mm/s, a pulse repetition rate in a range between about 1 kHz and about 1 MHz, a spot size in a range between about 4 µm and about 12 µm, pulse energy in a range between about 10 µJ and about 1,000 µJ, and a UV wavelength in a range between about 352 nm and about 355 nm. In another embodiment, in the third pass, the laser beam 916 has a green wavelength (e.g., about 532 nm. In yet another embodiment, in the third pass, the laser beam has an IR wavelength (e.g., as produced by a $CO_2$ laser). Persons skilled in the art will recognize from the disclosure herein that other types of lasers or laser parameters may be used for each of the three passes.

It will be understood by those having skill in the art that many changes may be made to the details of the above-described embodiments without departing from the underlying principles of the invention. The scope of the present invention should, therefore, be determined only by the following claims.

The invention claimed is:

1. A method for dicing a semiconductor wafer including a top surface and a bottom surface, the bottom surface attached to an underlying layer of material, and the top surface comprising one or more device layers including a pattern of multiple, mutually spaced apart electronic circuit components separated by one or more streets, the method comprising:
    applying a coating to the semiconductor wafer to protect the semiconductor wafer from debris generated by a first laser beam;
    generating the first laser beam;
    providing relative movement of the first laser beam with respect to the top surface of the semiconductor wafer to:
        in a first pass of the first laser beam along one or more dicing streets, scribe the one or more device layers; and in a second pass of the first laser beam along the one or more streets, at least partially dice the semiconductor wafer from the top surface along the one or more dicing streets, the first laser beam forming a kerf defined by sidewalls in the semiconductor wafer;

washing the semiconductor wafer to remove the coating;

etching the sidewalls of the at least partially diced semiconductor wafer to reduce or remove a heat affected zone (HAZ) produced in the sidewalls by the first laser beam; and cutting through the underlying layer of material along the one or more dicing streets so as to separate a die from the semiconductor wafer having at least a predetermined die break strength and to produce a yield of operational die that equals at least a predetermined minimum yield, the sidewall etching being performed before the cutting through the underlying layer of material to reduce or prevent debris on the sidewalls from the underlying layer of material during the etching of the sidewalls.

2. The method of claim 1, wherein the underlying layer of material comprises a die attach film (DAF).

3. The method of clam 2, wherein cutting through the underlying layer of material comprises:

generating a second laser beam; and providing relative movement of the second laser beam with respect to the DAF along the one or more dicing streets.

4. The method of claim 3, wherein the first laser beam comprises a pulsed laser beam having an ultraviolet (UV) wavelength and with temporal pulsewidths selected from the group comprising nanosecond temporal pulsewidths and picosecond temporal pulsewidths.

5. The method of claim 4, wherein the second laser beam comprises a pulsed laser beam having a visible wavelength and with nanosecond temporal pulsewidths.

6. The method of claim 2, wherein etching the sidewalls comprises using a first etchant configured to remove semiconductor material from the semiconductor wafer, and wherein cutting through the underlying layer of material comprises using a second etchant configured to remove the DAF material.

7. The method of claim 6, wherein the first etchant comprises a spontaneous etchant.

8. The method of claim 7, wherein the spontaneous etchant comprises xenon difluoride ($XeF_2$).

9. The method of claim 6, wherein the second etchant comprises an oxide etchant.

10. The method of claim 1, wherein the underlying layer of material comprises a metal.

11. The method of claim 10, wherein cutting through the underlying layer of material comprises:

generating a second laser beam; and providing relative movement of the second laser beam with respect to the metal along the one or more dicing streets.

12. The method of claim 10, wherein etching the sidewalls comprises using a first etchant configured to remove semiconductor material from the semiconductor wafer, and wherein cutting through the underlying layer of material comprises using a second etchant configured to remove the metal.

* * * * *